United States Patent [19]
Ono

[11] Patent Number: 5,401,992
[45] Date of Patent: Mar. 28, 1995

[54] HIGH-DENSITY NONVOLATILE SEMICONDUCTOR MEMORY

[75] Inventor: Takashi Ono, Tokyo, Japan

[73] Assignee: Oki Electric Industry Co., Ltd., Tokyo, Japan

[21] Appl. No.: 153,101

[22] Filed: Nov. 17, 1993

[30] Foreign Application Priority Data

Nov. 25, 1992 [JP] Japan .................. 4-314954

[51] Int. Cl.6 .................. H01L 29/14; H01L 29/788
[52] U.S. Cl. .................. 257/315; 257/314; 257/382
[58] Field of Search .............. 345/185; 257/315, 314, 257/382, 383

[56] References Cited

U.S. PATENT DOCUMENTS 5,149,665  9/1992  Lee .
5,210,047  5/1993  Woo et al. .

FOREIGN PATENT DOCUMENTS 0436475  7/1991  European Pat. Off. .
0502438  9/1992  European Pat. Off. .
2214157  8/1990  Japan .................. 257/383
3101231  4/1991  Japan .................. 257/383

*Primary Examiner*—Ngân V. Ngô
*Assistant Examiner*—Stephen D. Meyer
*Attorney, Agent, or Firm*—Wenderoth, Lind & Ponack

[57] ABSTRACT

A nonvolatile semiconductor memory has active regions that form parallel strips extending in a first direction in a semiconductor substrate. Each active region has source areas, drain areas, and channel areas for a series of memory cells. Floating gates are formed over the channel areas, and control gates over the floating gates. The upper surfaces of the control gates and the sides of the control gates and floating gates are covered by insulating films. Source interconnecting lines made of a conductive material are formed as parallel strips extending in a second direction different from the first direction on the semiconductor substrate, interconnecting the source areas of the memory cells.

12 Claims, 12 Drawing Sheets

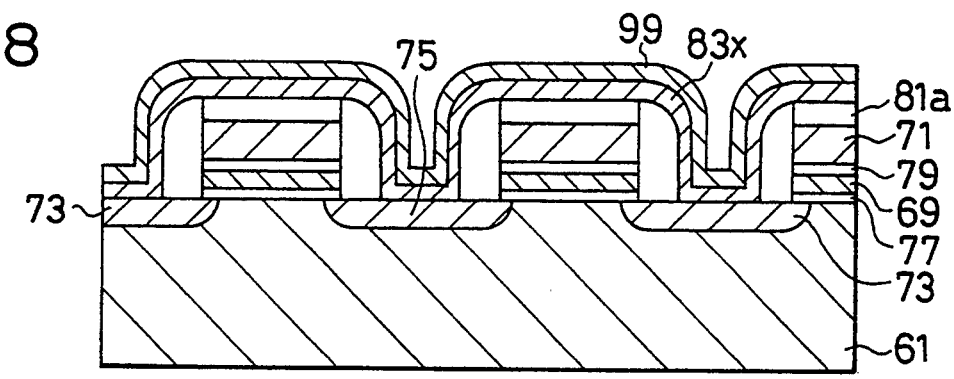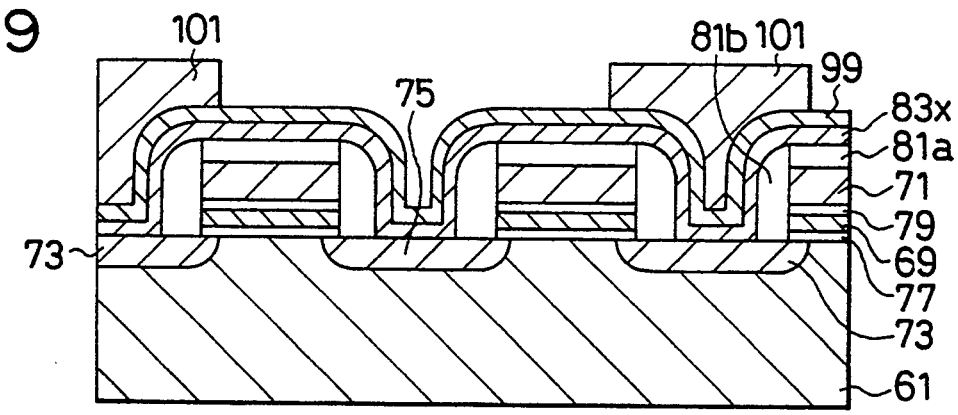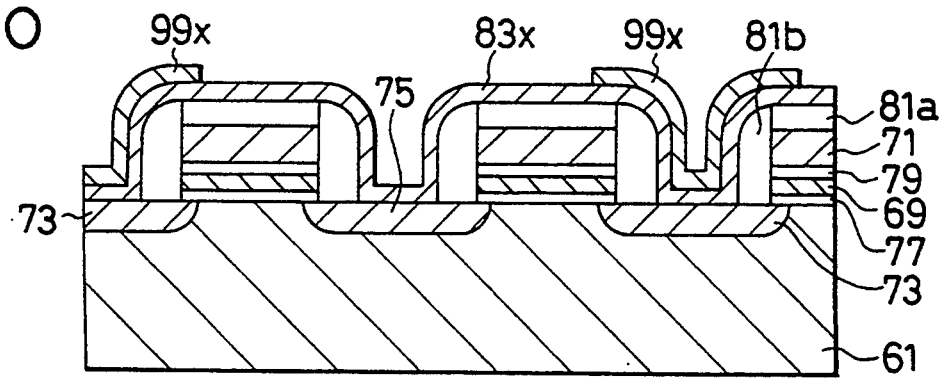

HIGH-DENSITY NONVOLATILE SEMICONDUCTOR MEMORY

BACKGROUND OF THE INVENTION

This invention relates to a nonvolatile semiconductor memory, more particularly to a nonvolatile semiconductor memory having uniform program and erase characteristics and capable of high-density integration.

Nonvolatile reprogrammable semiconductor memories such as an electrically erasable programmable read-only memory (EEPROM) and a flash memory are ideal for storing data that only occasionally need to be modified, because they can retain the data while power is off. Memories of this type are used in many computing devices and systems.

FIG. 1 shows a sectional view of the memory cell structure of a conventional reprogrammable nonvolatile memory. The semiconductor substrate 11 comprises crystalline silicon. A floating gate 13 disposed above the substrate 11, a control gate 15 disposed above the floating gate 13, and a source area 17 and drain area 19, which are formed by doping the substrate 11 on either side of the gates 13 and 15 with impurities, are the principal elements of a memory cell 21. These elements form a field-effect transistor with an active region comprising the source area 17, the drain area 19, and a channel 22 disposed in the substrate 11 between the source and drain areas. These elements are covered by an insulating film 23, in which a contact hole 25 is opened to permit a metal interconnecting line 27 (a bit line) to make contact with the drain area 19. The source and drain areas 17 and 19 of the memory cell 21 are shared with other memory cells adjacent in a first direction, which will be marked as the y-direction in the drawings.

FIG. 2 shows a plan view of several memory cells in a conventional nonvolatile memory, using the same reference numerals as in FIG. 1. FIG. 1 corresponds to a section through the line I—I. The y-direction is vertical in FIG. 2; the perpendicular direction (now horizontal) is denoted the x-direction. It can be seen that the source areas 17 extend in the x-direction so as to interconnect all memory cells disposed in the same horizontal row. The control gates 15 are also interconnected in the x-direction, forming word lines. The floating gates 13 (hatched) are not interconnected.

FIG. 3 is a simplified plan view from which the gates, word lines, and bit lines have been removed to show the shape of the active region 31. Due to the sharing of source and drain areas between adjacent memory cells in the y-direction, and the extensions of the source areas in the x-direction, the active region 31 has the general form of a rectilinear grid. In areas not occupied by the active region 31, the surface of the substrate is oxidized to create insulating field areas 33.

Referring again to FIG. 2, the source areas 17 are held at a constant electrical potential by means of metal source lines 35 that run parallel to the bit lines 27 in the y-direction. Each metal source line 35 makes contact with the source areas 17 in the substrate through contact holes 37 which are opened in the insulating layer 23 shown in FIG. 1. One metal source line 35 is provided for every m bit lines 27, where m is a positive integer. For example, one metal source line 35 may be provided per sixteen bit lines 27.

One problem with the conventional memory structure illustrated in FIGS. 1 to 3 is that the source resistance of a memory cell varies depending on its distance from the metal source lines 35. If there is one metal source line 35 for every sixteen bit lines 27, for example, the eighth memory cell from a metal source line 35 has a higher source resistance than a memory cell disposed adjacent to a metal source line 35.

The source resistance can become quite substantial. For example, if the x-pitch of the memory cells is 2.0 $\mu$m (indicated by the capital letter X in FIG. 2), the width (in the y-direction) of the source areas 17 is 0.5 $\mu$m, and the sheet resistivity of the source areas is 50 $\Omega$, then the source resistance of the eighth memory cell, disposed midway between two metal source lines, is $(50 \times 2.0 \times 8/0.5)/2 = 800$ $\Omega$. The final division by two in this formula takes account of the parallel electrical paths to two metal source lines 35.

A high source resistance degrades programming and erasing characteristics, i.e. it takes longer to program and erase the memory cells. The large variation in source resistance from one cell to another furthermore makes it difficult to program and erase the cells accurately, increasing the risk of overprogramming and overerasing.

Another problem is that providing metal source lines 35 every m bit lines increases the effective x-pitch of the memory cells by a factor of $(m+1)/m$, which is a disadvantage from the standpoint of integration density.

Impediments to dense integration also exist in the y-direction. The y-pitch of the memory cells, indicated by the capital letter Y in FIG. 2, is the sum of five quantities: $Y_1$ (one-half the y-dimension of the source area 17); $Y_2$ (the gap between the gates 13 and 15 and the active region 31); $Y_3$ (the gate length); $Y_4$ (the gap between the gates 13 and 15 and the contact hole 25); and $Y_5$ (one-half the y-dimension of the contact hole 25). The gap $Y_2$ is needed to ensure that the floating gates 13 and control gates 15 cross the active regions 31 only in the channel areas of the memory cells, and do not overlap the extensions of the source areas 17 in the x-direction. The need for the gap $Y_4$ is apparent from FIG. 1; it keeps the gates from being short-circuited to the bit lines. Both gaps $Y_2$ and $Y_4$ must be big enough to allow a mask overlay tolerance during the memory fabrication process; this restricts the achievable integration density.

On the basis of 0.6-$\mu$m design rules, the above quantities can be estimated as follows: $Y_1 = 0.25$ $\mu$m, $Y_2 = 0.25$ $\mu$m, $Y_3 = 0.7$ $\mu$m, $Y_4 = 0.3$ $\mu$m, and $Y_5 = 0.3$ $\mu$m. The y-pitch Y is accordingly 1.8 $\mu$m. Details will be omitted, but the x-pitch with the same 0.6-$\mu$m design rules is 2 $\mu$m.

Another problem occurring in the conventional memory is that, due to mask misregistration, in some cases the floating gates 13 may be disposed quite close to the edges of the field areas 33, where the field oxide is relatively thin, while in other cases they are disposed farther from the edges, where the field oxide is relatively thick. This leads to variation in the potential of the floating gates 13, which is a source of further nonuniformity in programming and erasing characteristics.

SUMMARY OF THE INVENTION

It is accordingly an object of the present invention to provide a nonvolatile semiconductor memory with more uniform programming and erasing characteristics.

Another object of the invention is to increase the integration density of a nonvolatile semiconductor memory.

Yet another object is to reduce the source resistance of memory cells in a nonvolatile semiconductor memory.

Still another object is to overcome fabrication restrictions imposed by the photolithography resolution limit.

A further object is to fabricate a nonvolatile semiconductor memory efficiently.

A nonvolatile semiconductor memory in accordance with the present invention has a plurality of active regions forming parallel strips extending in a first direction in a semiconductor substrate. Each active region has source areas, drain areas, and channel areas for a plurality of memory cells. Floating gates are formed over the channel areas, and control gates over the floating gates. The upper surfaces of the control gates and the sides of the control gates and floating gates are covered by insulating films. Source interconnecting lines comprising a conductive material are formed on the semiconductor substrate as parallel strips extending in a second direction different from the first direction, interconnecting the source areas.

The invented memory may also have conductive drain pads covering the drain areas. The drain pads are preferably formed from the same material as the source interconnecting lines. The drain pads and source interconnecting lines can then be formed by depositing a thin film of this material, creating on this thin film a first mask defining the source interconnecting lines, also creating on this thin film a second mask defining the drain pads, and etching the thin film in areas not protected by the first and second masks.

BRIEF DESCRIPTION OF THE DRAWINGS

FIG. 18 is a sectional drawing illustrating a stage in a third fabrication method for the novel memory.

FIG. 19 is a sectional drawing illustrating another stage in the third fabrication method.

FIG. 20 is a sectional drawing illustrating another succeeding stage in the third fabrication method.

DETAILED DESCRIPTION OF THE INVENTION

Embodiments of the invention will now be described with reference to the attached drawings. These drawings are provided only for aid in understanding the invention, and show the dimensions, shapes, and positional relationships of the elements only schematically. They do not define the scope of the invention, which should be determined solely from the appended claims.

Figure 1:
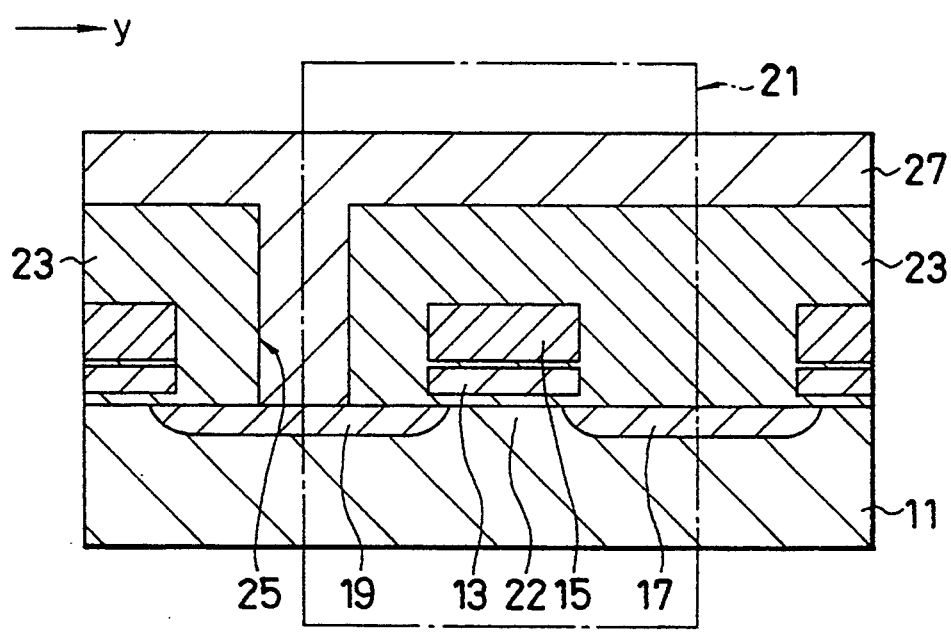
FIG. 1 is a sectional drawing of a conventional nonvolatile semiconductor memory.
Figure 2:
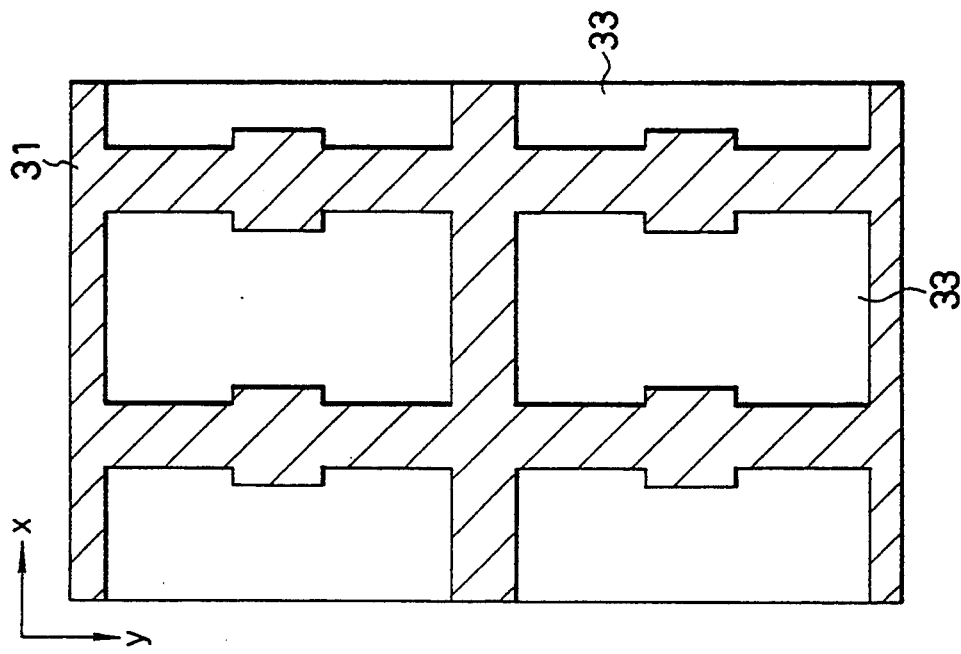
FIG. 2 is a plan drawing of a conventional nonvolatile semiconductor memory.
Figure 3:
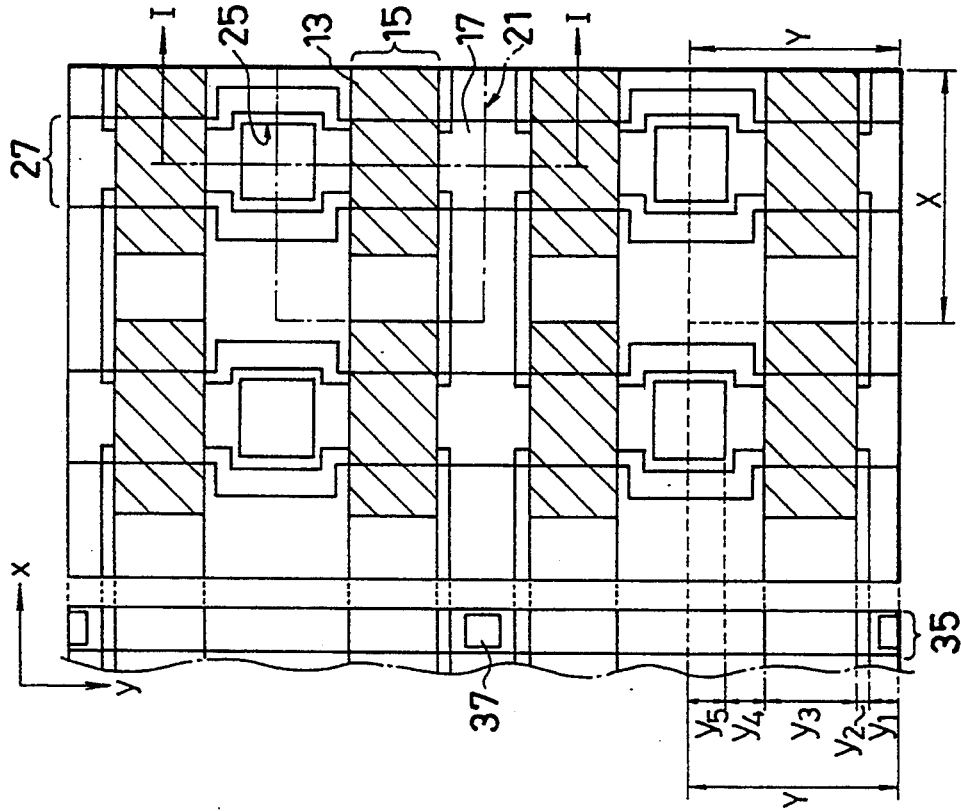
FIG. 3 is a simplified plan drawing of a conventional nonvolatile semiconductor memory, showing its active regions.
Figure 4:
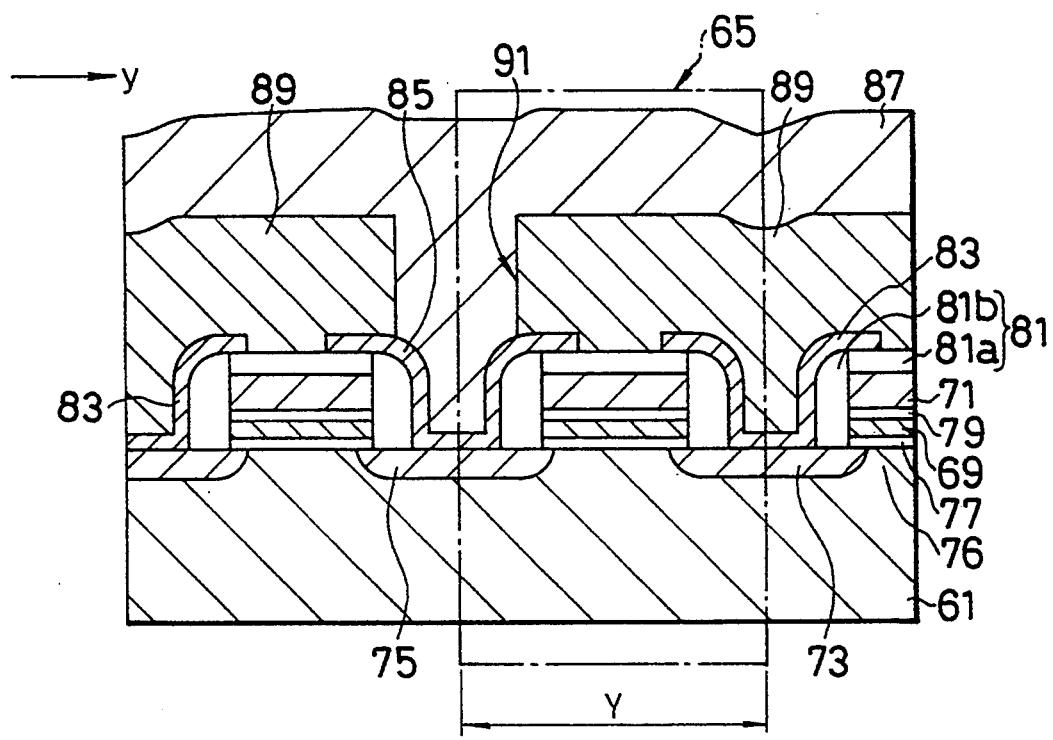
FIG. 4 is a sectional drawing of a novel nonvolatile semiconductor memory.

Referring to FIG. 4, a memory in accordance with the present invention comprises a semiconductor substrate 61 such as a crystalline silicon substrate for the formation of memory cells 65. Each memory cell 65 comprises a floating gate 69, a control gate 71, a source area 73, and a drain area 75 as in the prior art, with a channel 76 disposed below the floating gate 69 between the source and drain areas. The floating gate 69 is insulated from the channel 76 by a gate insulating film 77 comprising, for example, silicon dioxide, and from the control gate 71 by a similar insulating film 79.

The top surface and sides of the gate structure in each memory cell are covered by a further insulating film 81 comprising, in this embodiment, a top insulating film 81a and side insulating films 81b. The top insulating film 81a covers the upper surface of the control gate 71. The side insulating films 81b cover the sides of both the floating and control gates 69 and 71, and of the insulating films 79 and 77 above and below the floating gate 69.

The top and side insulating films 81a and 81b in this embodiment are formed separately, as will be described later. The invention can also be practiced, however, with a single insulating film covering both the top and sides of the gate structure.

The surface of each source area 73, and the adjacent surfaces of the side insulating films 81b, are covered by a novel source interconnecting line 83 comprising a conductive material: for example, a refractory metal such as tungsten. The source interconnecting lines 83 may also partly cover the top insulating layer 81a, as shown in the drawing. The source interconnecting lines 83 run perpendicular to the page, in the x-direction, as will be shown later.

The surface of each drain area 75 is covered by a pad 85, which also covers the adjacent side insulating layers 81b and extends onto the top insulating layers 81a. The pad 85 provides a self-aligned electrical contact between the drain area 75 and a bit line 87. The drain pads 85 are preferably formed of the same material as the source interconnecting lines 83.

The bit lines 87 run in the y-direction, which is the horizontal direction in FIG. 4. The bit lines 87 are separated from the underlying structure by an inter-layer insulating film 89, in which contact holes 91 are opened to provide access to the drain pads 85.

Figure 5:
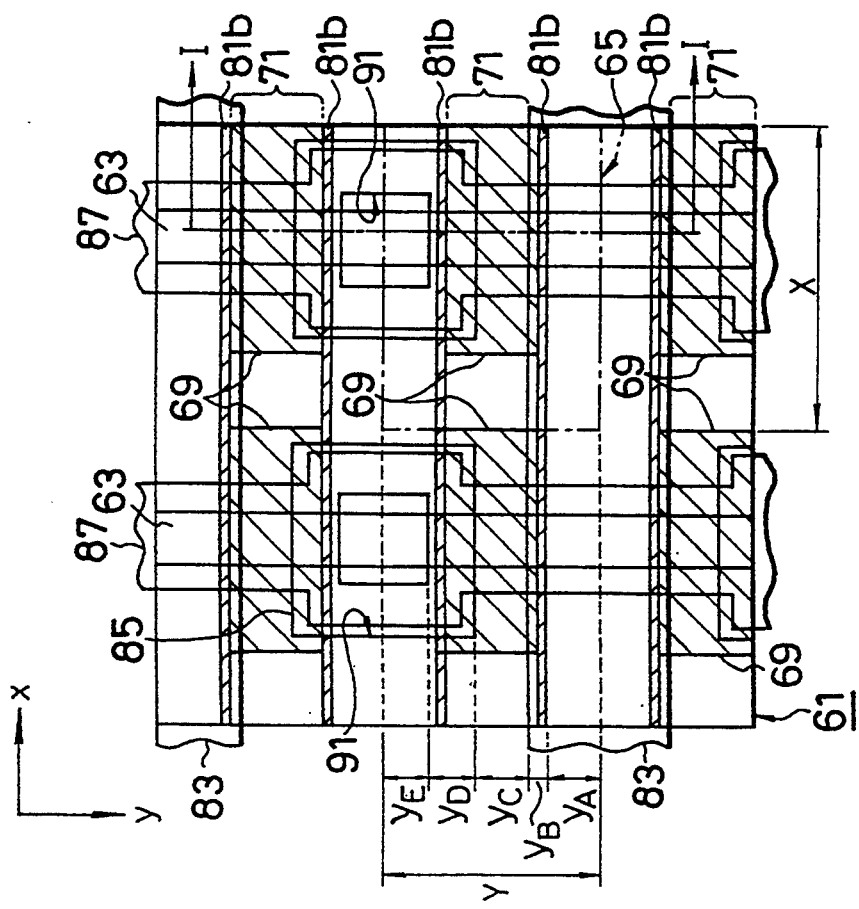
FIG. 5 is a plan drawing of the novel memory.

FIG. 5 shows a plan view of a memory in accordance with the present invention, using the same reference numerals as in FIG. 4. The y-direction is now vertical and the x-direction horizontal. FIG. 4 corresponds to a section through the line I—I in FIG. 5. The source areas 73, drain areas 75, and channels 76 that were illustrated in FIG. 4 are indicated only as active regions 63 in FIG. 5. The source interconnecting lines 83 can be seen to have the form of strips running in the x-direction. The control gates 71 are interconnected in the x-direction, forming word lines, as in the prior art.

Figure 6:
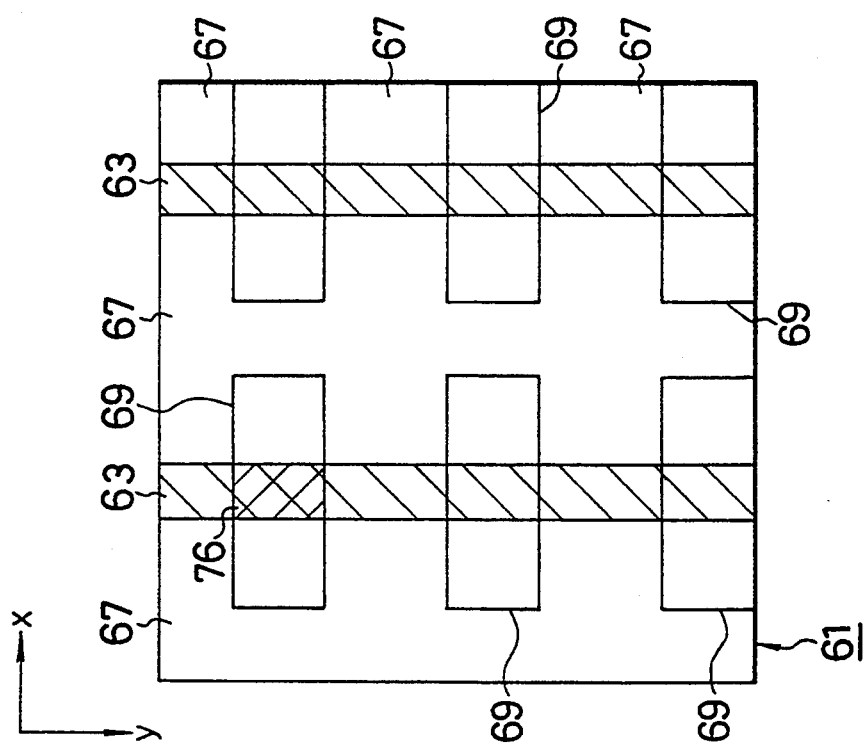
FIG. 6 is a simplified plan drawing of the novel memory, showing its active regions and floating gates.

FIG. 6 is a simplified plan view showing only the active regions 63, field areas 67, floating gates 69, and channels 76. The active regions 63 are seen to have the form of parallel strips extending in the y-direction, instead of forming an x-y grid as in the conventional memory. The field areas 67 that separate the active regions 63 comprise, for example, oxidized regions as in a conventional memory.

As noted above, FIGS. 4 to 6 are schematic and do not necessarily represent the exact shapes of their constituent elements. For example, the active regions 63 need not be perfectly straight strips as shown in FIG. 6; their edges may curve in and out somewhat, following contours defined by diffusion in the source and drain doping process.

A description of the operation of the memory in accordance with the present invention has been omitted, as it is the same as the operation of a conventional memory and will be familiar to those skilled in the art. Instead, the advantages of the memory in accordance with the present invention are described below.

A first advantage is that the source areas 73 of the memory cells are interconnected by source interconnecting lines 83 formed by depositing a conductive material, instead of by extensions of the source areas formed by doping the substrate with impurities. This feature of the invention can greatly reduce the source resistance of the memory cells. If, for example, the source interconnecting lines 83 comprise a tungsten film 100 nm thick and 0.5 $\mu$m wide, with a volume resistivity of $5.4 \times 10^{-8}$ $\Omega \cdot$m, and the x-pitch is 2 $\mu$m per memory cell, then the source resistance will be $(5.4 \times 10^{-8} \times 2 \times 10^{-6})/(100 \times 10^{-9} \times 0.5 \times 10^{-6}) = 2.16$ $\Omega$ per memory cell. Even if a source interconnecting line 83 is used to interconnect a row of one thousand memory cells, the source resistance of a memory cell in the center of this row will only be $(500 \times 2.16)/2 = 540$ $\Omega$. The utility of the invention can be understood by comparing this value with the 800 $\Omega$ for a row of only sixteen memory cells disposed between two conventional metal source lines in the prior art.

A second advantage is that, compared with the prior art, there is less variation in source resistance from one memory cell to another.

A third advantage is that the conventional metal source lines are unnecessary. The density in the x-direction can therefore be increased by a factor of $(m+1)/m$, where m is the number of bit lines between each pair of metal source lines in a conventional memory.

A fourth advantage is that the y-pitch of the memory cells can be reduced. Referring to FIG. 4, since the drain pads 85 are self-aligned, no gap between them and the floating and control gates 69 and 71 is necessary, other than the gap provided by the thickness of the side insulating layers 81$b$. Similarly, no gap is required between the source interconnecting lines 83 and these gates, other than the thickness of the side insulating layers 81$b$. Referring to FIG. 6, since the active regions 63 do not extend in the x-direction, no gap is necessary to keep the floating gates 69 from overlapping the active regions 63 outside the channel areas 76.

Referring to FIG. 5, the y-pitch of the memory cells, indicated by the capital letter Y, is the sum of five quantities: $y_A$ (half the distance between adjacent gates); $y_B$ (overlap of the source interconnecting lines on the gates); $y_C$ (gap between source interconnecting lines and drain pads); $y_D$ (alignment margin of contact holes and drain pads); and $y_E$ (half the contact-hole diameter). If these dimensions are estimated from 0.6-$\mu$m design rules, and if mask registration accuracy is assumed to be 0.3 $\mu$m, then $y_E$ is 0.3 $\mu$m, $y_D$ is 0.3 $\mu$m (maximum mask misregistration), $y_C$ is 0.4 $\mu$m (preventing a short circuit even if this degree of misregistration occurs), $y_B$ is 0.1 $\mu$m, and $y_A$ is 0.4 $\mu$m. The resulting y-pitch is 1.5 $\mu$m, a reduction of 0.3 $\mu$m from the conventional 1.8 $\mu$m.

The values of $y_A$ and $y_B$ are subject to adjustment depending on the thickness of the side insulating films 81$b$ and variability in the fabrication process. A feature of the invented fabrication methods, which will be described later, is that the value of $y_C$ (0.4 $\mu$m in the example above) can be less than the design-rule value (0.6 $\mu$m) set by the photolithography resolution limit.

A fifth advantage, which will be obvious from FIG. 6, is that the potential of the floating gates is not subject to variation due to location over thicker or thinner portions of the field oxide, resulting from mask misregistration in the y-direction. The oxide thickness of the field areas 67 is uniform everywhere in the y-direction, since these areas are not interrupted by the conventional extensions of the active regions in the x-direction.

Overall, the first advantage implies improved device characteristics (faster programming and erasing), the second and fifth advantages imply less variability in device characteristics, and the third and fourth advantages imply higher integration density for given design rules.

Next, a first novel method of fabricating the memory in accordance with the present invention is described below with reference to FIGS. 6 to 14, using the same reference numerals as in FIG. 4.

Referring again to FIG. 6, fabrication begins with oxidation of the semiconductor substrate 61 by well-known methods to create the field areas 67. The field areas 67 are formed so as to leave active regions 63 in the semiconductor substrate 61, extending as parallel strips in the y-direction. The field areas 67 are insulating areas that isolate the active regions 63 from one another.

Figure 7:
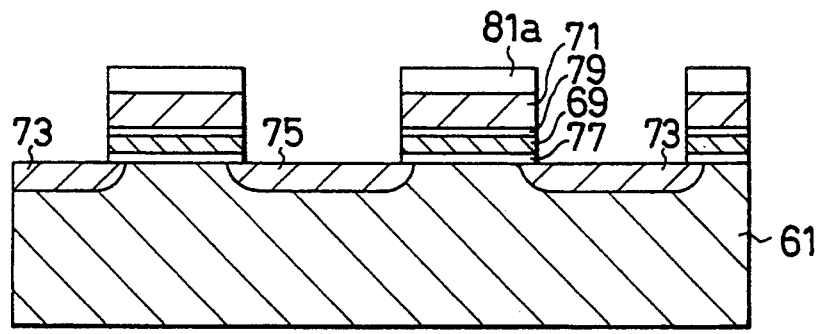
FIG. 7 is a sectional drawing illustrating a stage in a first fabrication method for the novel memory.

Referring to FIG. 7, next an insulating film, a thin floating-gate film, another insulating film, a conductive control-gate film, and yet another insulating film are deposited on the substrate 61 in the order stated, and these films are patterned by photolithography and etching techniques to obtain the gate insulating film 77, the floating gates 69, the insulating film 79 between the floating gates 69 and control gates 71, the control gates 71, and the top insulating film 81$a$. Source areas 73 and drain areas 75 are then formed by doping portions of the substrate 61 adjacent to the gates 69 and 71 with suitable impurities. Deposition, photolithography, etching, and doping methods are well known, so detailed descriptions therefore has been omitted.

Figure 8:
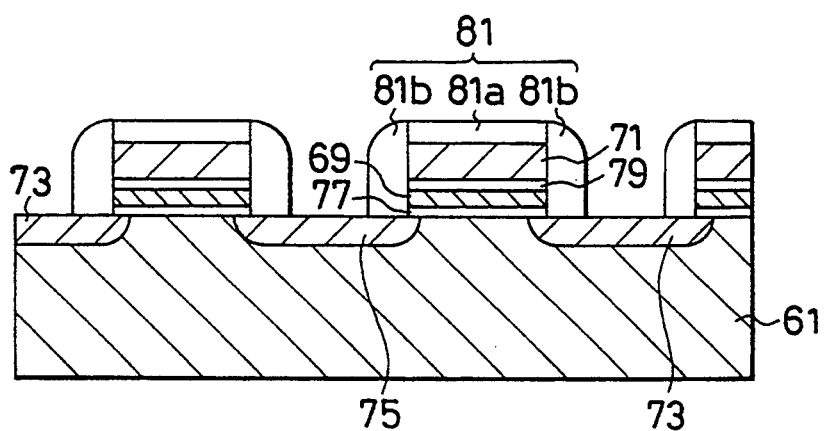
FIG. 8 is a sectional drawing illustrating a succeeding stage in the first fabrication method.

Referring to FIG. 8, another insulating film is now deposited, then selectively removed by anisotropic etching to create the side insulating films 81b. The steps so far cover the upper surface of the control gates 71 and the sides of the floating and control gates 69 and 71 with an insulating film 81 comprising the insulating films 81a and 81b.

This insulating film 81 has been described as being formed by deposition and etching, but other methods can of course be used. For example, if the floating and control gates 69 and 71 comprise polysilicon, the insulating film 81 can be created by oxidation of the side surfaces of the floating and control gates 69 and 71 and the upper surface of the control gates 71.

Figure 9:
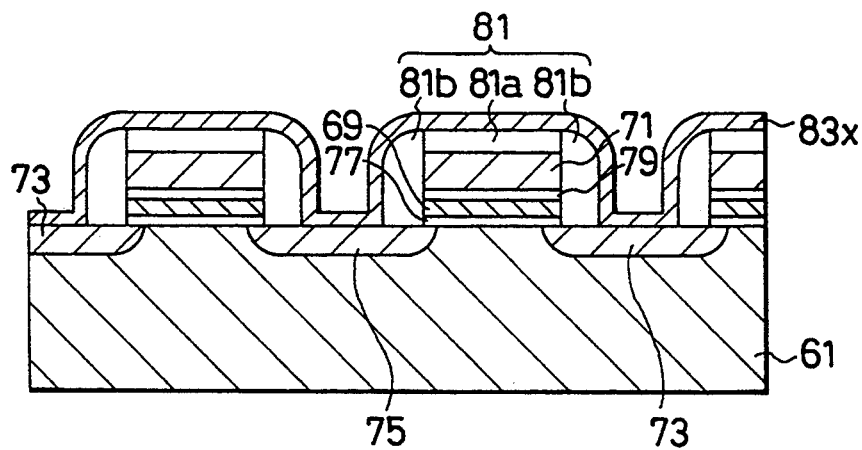
FIG. 9 is a sectional drawing illustrating another succeeding stage in the first fabrication method.

Referring to FIG. 9, a thin conductive film (for example, a tungsten film) 83x is now formed on the entire surface of the memory device, including the exposed surfaces of the source and drain areas 73 and 75.

This conductive film 83 x will next be patterned to create the source interconnecting lines and drain pads. Two separate masks will be employed, one for the source interconnecting lines and one for the drain pads. Either mask may be formed first. In the description that follows, the source-interconnecting-line mask is formed first, but the invention may of course be practiced by forming the drain-pad mask first.

Figure 10:
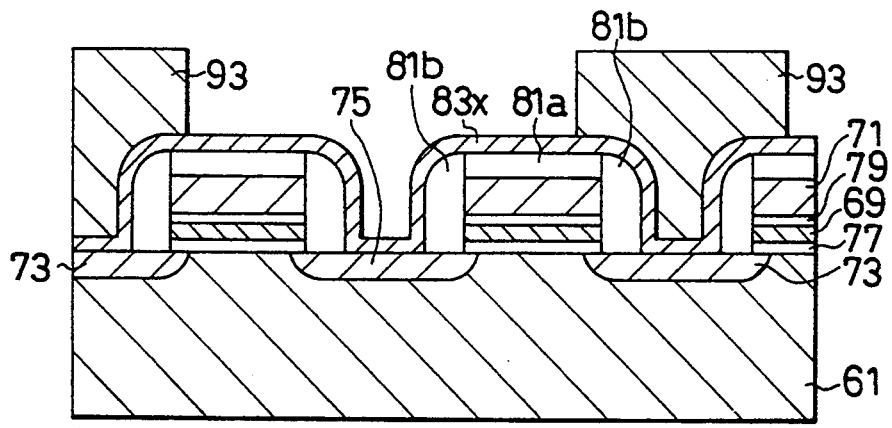
FIG. 10 is a sectional drawing illustrating another succeeding stage in the first fabrication method.

Referring to FIG. 10, the device is next coated with a photoresist, which is patterned by photolithography to obtain a first photoresist pattern 93 that will serve as a mask defining the source interconnecting lines. The first photoresist pattern 93 is then cured by heating, by illumination with ultraviolet light, or by another suitable method that strengthens or hardens the photoresist. The cured photoresist pattern will be denoted by reference numeral 93a in the following drawings.

Figure 11:
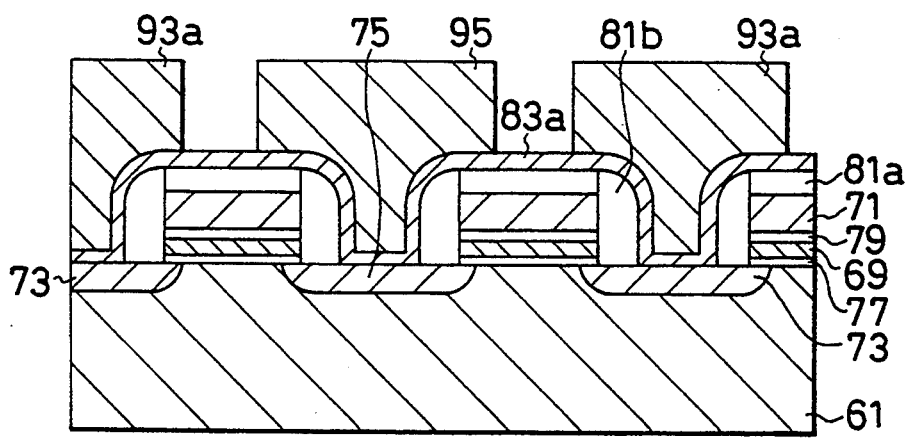
FIG. 11 is a sectional drawing illustrating another succeeding stage in the first fabrication method.

Referring to FIG. 11, a new photoresist is now applied to the entire surface of the device and patterned by photolithography to form a second photoresist pattern 95, which will serve as a mask defining the drain pads. The cured first photoresist pattern 93a is not damaged by the photolithography step that forms the second photoresist pattern 95.

Since the first photoresist pattern 93 and second photoresist pattern 95 are formed by separate photolithography steps, the dimensions of the gaps between them, which will become the spaces between the source interconnecting lines and drain pads, are not constrained by the design rules imposed by photolithography resolution; these gaps can be even smaller than the design-rule limit. As noted earlier, this is one of the features of the present invention that enables high integration density.

Figure 12:
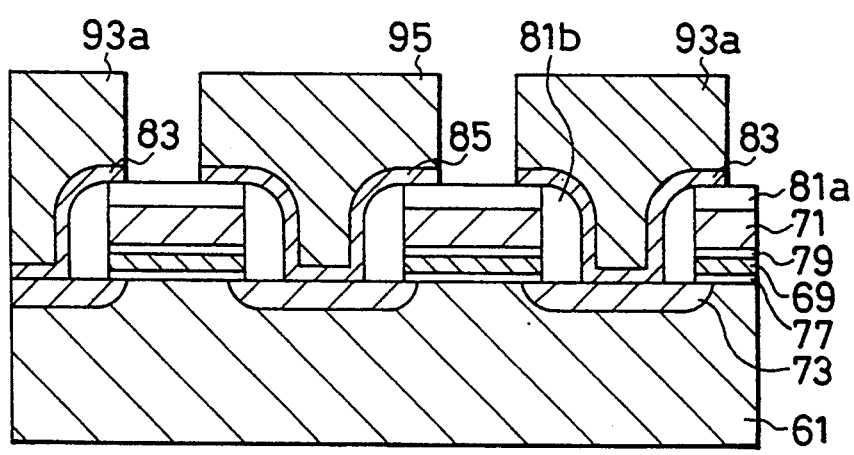
FIG. 12 is a sectional drawing illustrating another succeeding stage in the first fabrication method.

Referring to FIG. 12, the thin conductive film 83x is now selectively etched, using the second photoresist pattern 95 and the cured first photoresist pattern 93a as masks. In this way the source interconnecting lines 83 and drain pads 85 are formed.

Figure 13:
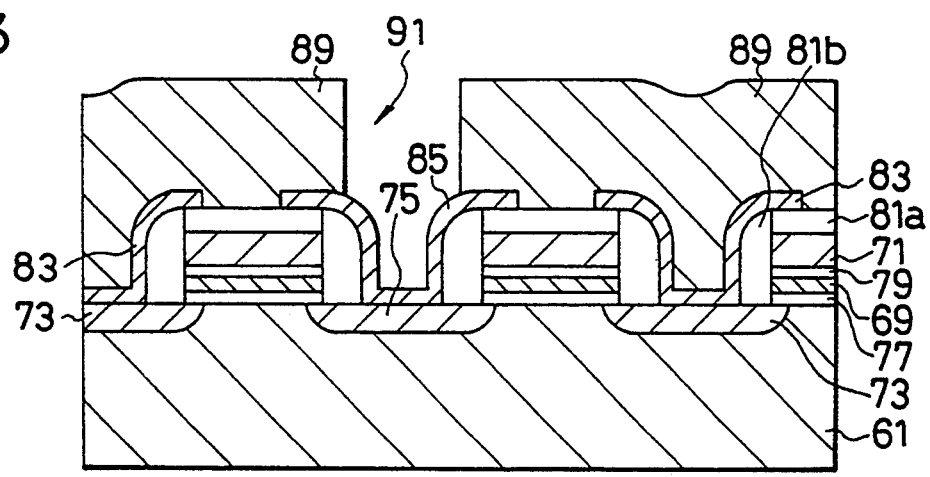
FIG. 13 is a sectional drawing illustrating another succeeding stage in the first fabrication method.

Referring to FIG. 13, the photoresist patterns 93a and 95 are now removed and an inter-layer insulating film 89 is deposited, covering the entire surface of the device. Contact holes 91 are opened in this film 89 over the drain pads 85.

Figure 14:
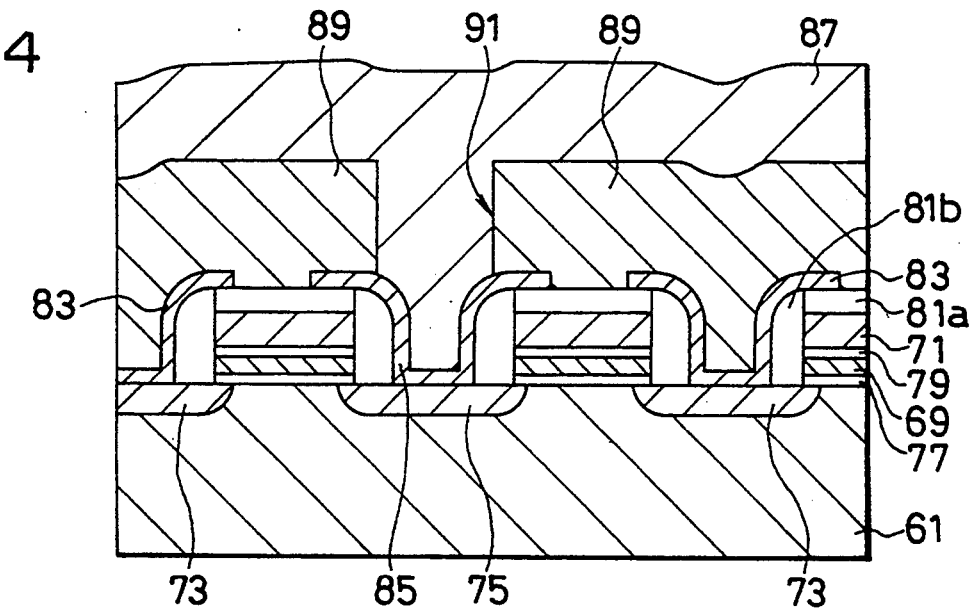
FIG. 14 is a sectional drawing illustrating another succeeding stage in the first fabrication method.

Finally, referring to FIG. 14, the bit lines 87 are created by well-known methods, completing the structure that was shown in FIG. 4.

Next a second fabrication method will be described with reference to FIGS. 15 to 17. This second method is a modification of the first method, differing in the way in which the masks for the source interconnecting lines and drain pads are created. The initial steps through the formation of the thin conductive film 83 x are the same as in the first method, as illustrated in FIGS. 6 to 9.

Figure 15:
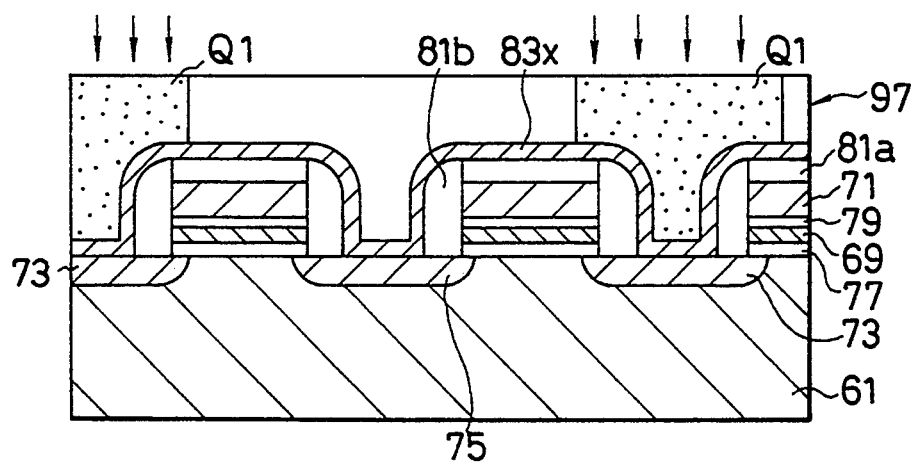
FIG. 15 is a sectional drawing illustrating a stage in a second fabrication method for the novel memory.

Referring to FIG. 15, following the steps in FIGS. 6 to 9, a negative photoresist 97 is applied to the entire surface of the device. This negative photoresist will be exposed twice, once to form masks for the source interconnecting lines and once to form masks for the drain pads. Either exposure may be carried out first. FIG. 15 shows the exposure for the source interconnecting lines being made first, the exposed area being denoted $Q_1$.

Figure 16:
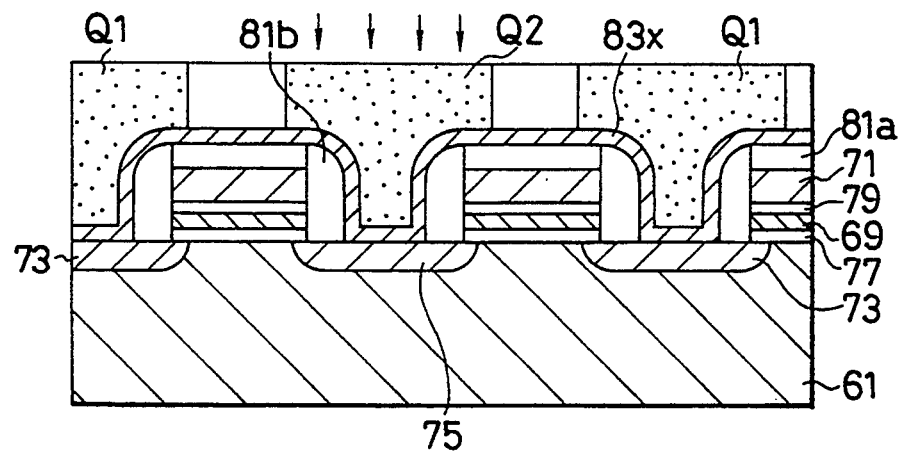
FIG. 16 is a sectional drawing illustrating a succeeding stage in the second fabrication method.

Referring to FIG. 16, after the first exposure is completed, the negative photoresist 97 is exposed a second time to form masks for the drain pads. The exposed areas are denoted $Q_2$ in the drawing.

Figure 17:
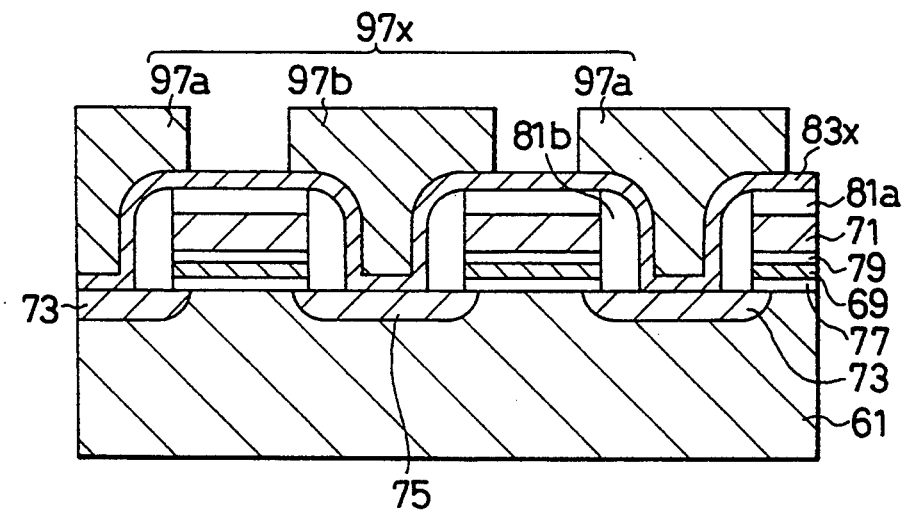
FIG. 17 is a sectional drawing illustrating another succeeding stage in the second fabrication method.

Referring to FIG. 17, when the negative photoresist 97 is developed, the unexposed portions are removed and the exposed portions remain, forming a photoresist pattern 97 x comprising a mask 97a for the source interconnecting lines and another mask 97b for the drain pads.

The remaining steps of the second fabrication method are identical to the steps of the first fabrication method illustrated in FIGS. 12 to 14. An advantage of the second fabrication method is that the step of curing the first photoresist pattern in the first method can be omitted.

Next a third fabrication method will be described with reference to FIGS. 18 to 26. This third method is also a modification of the first fabrication method, and starts with the same initial steps through the formation of the thin conductive film 83 x, as illustrated in FIGS. 6 to 9.

Referring to FIG. 18, in the next step a thin film 99 comprising a material other than a photoresist is formed on the entire surface of the thin conductive film 83 x. The thin film 99 may be, for example, a silicon dioxide or silicon nitride film.

Referring to FIG. 19, a photoresist is now applied to the entire surface of this thin film 99 and patterned so as to leave a photoresist pattern 101 defining the source interconnecting lines.

Referring to FIG. 20, the thin film 99 is selectively etched using this photoresist pattern 101 as a mask, thereby obtaining a mask 99 x that also defines the source interconnecting lines. This etching step is carried out by a selective method that etches the thin film 99, but leaves the thin conductive film 83 x substantially intact. If the thin film 99 comprises silicon dioxide and the thin conductive film 83x comprises tungsten, a dry etching process using a mixture of $CHF_3$ and $CF_4$ gases can be employed.

Figure 21:
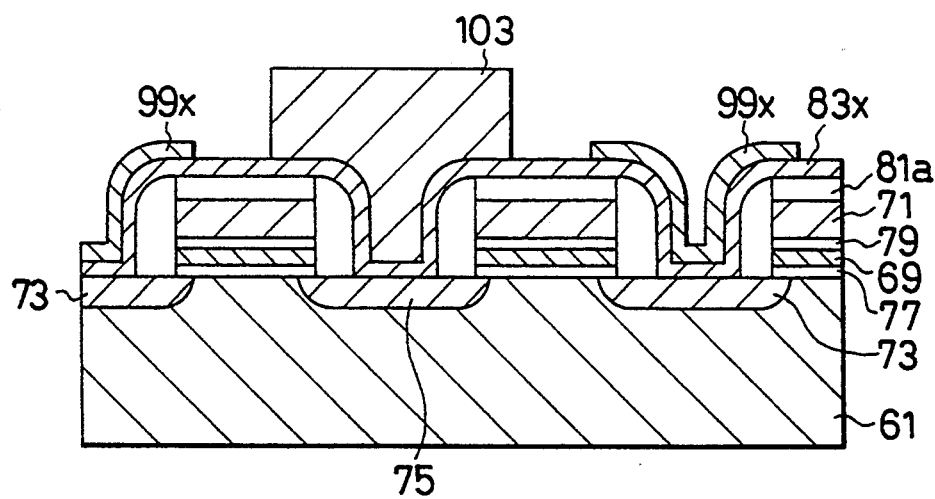
FIG. 21 is a sectional drawing illustrating another succeeding stage in the third fabrication method.

Referring to FIG. 21, another photoresist is now applied to the entire device and patterned, leaving a mask 103 defining the drain pads.

Figure 22:
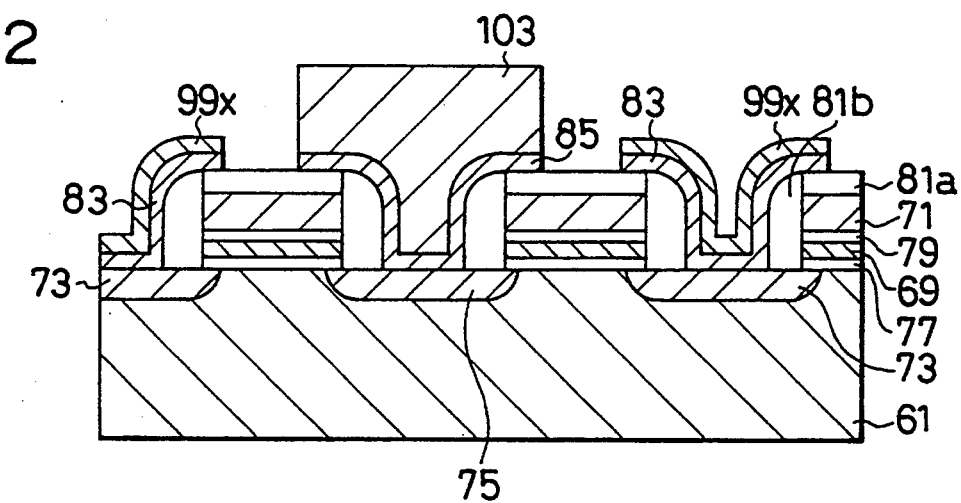
FIG. 22 is a sectional drawing illustrating another succeeding stage in the third fabrication method.

Referring to FIG. 22, the thin conductive film 83x is now selectively etched, removing parts not protected by the masks 99x and 103. This step creates the source interconnecting lines 83 and drain pads 85.

Figure 23:
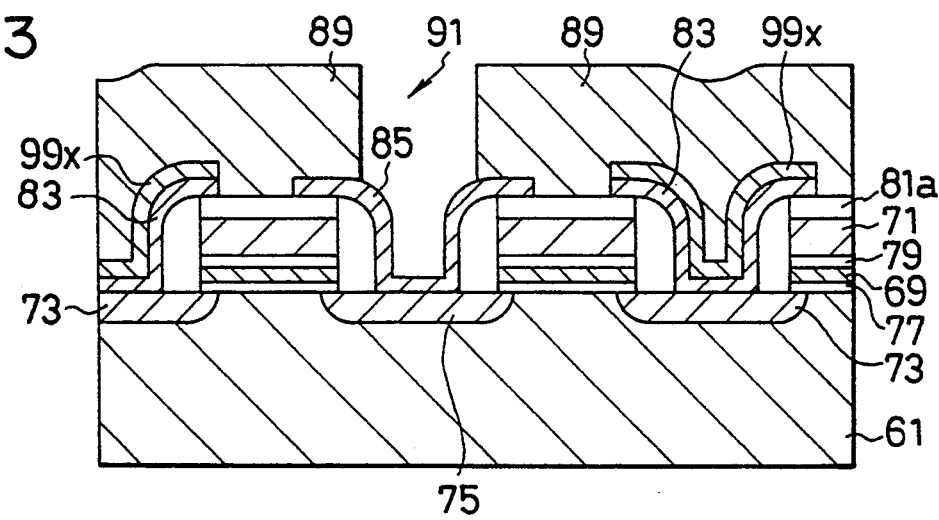
FIG. 23 is a sectional drawing illustrating another succeeding stage in the third fabrication method.

Referring to FIG. 23, the drain-pad mask 103 is removed, the inter-layer insulating film 89 is deposited, and contact holes 91 are opened. The mask 99x that defined the source interconnecting lines 83 is left in place.

Figure 24:
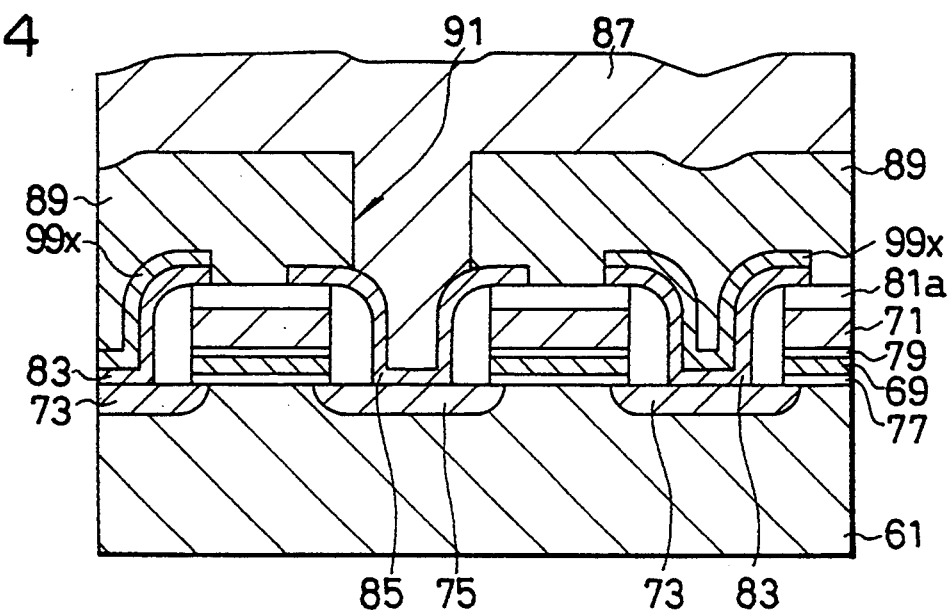
FIG. 24 is a sectional drawing illustrating another succeeding stage in the third fabrication method.

Referring to FIG. 24, the bit lines 87 are now formed. The resulting structure is identical to FIG. 4 except for the presence of the mask 99x on the source interconnecting lines 83. This remaining mask 99x does not impair the operation of the memory.

The third fabrication method can be modified in various ways. For example, the mask 99x can be removed before deposition of the inter-layer insulating film 89. Also, it is possible to form the mask for the drain pads first, using a material other than a photoresist (e.g. silicon dioxide), and form the mask for the source interconnecting lines second, using a photoresist material, instead of the other way around. Another alternative is to deposit a silicon nitride film, for example, on the silicon oxide film 99 of FIG. 18, then pattern these films by two sequential photolithography and etching steps. If this alternative is followed, one of the two masks (either the mask defining the source interconnecting lines or the mask defining the drain pads) will comprise a silicon oxide film, and the other mask (either the mask defining the drain pads or the mask defining the source interconnecting lines) will comprise a silicon nitride film.

An advantage of the third fabrication method is that a tougher mask is obtained than when the mask is formed only of a photoresist, so an improvement in the patterning accuracy of the source interconnecting lines and drain pads can be expected.

Figure 25:
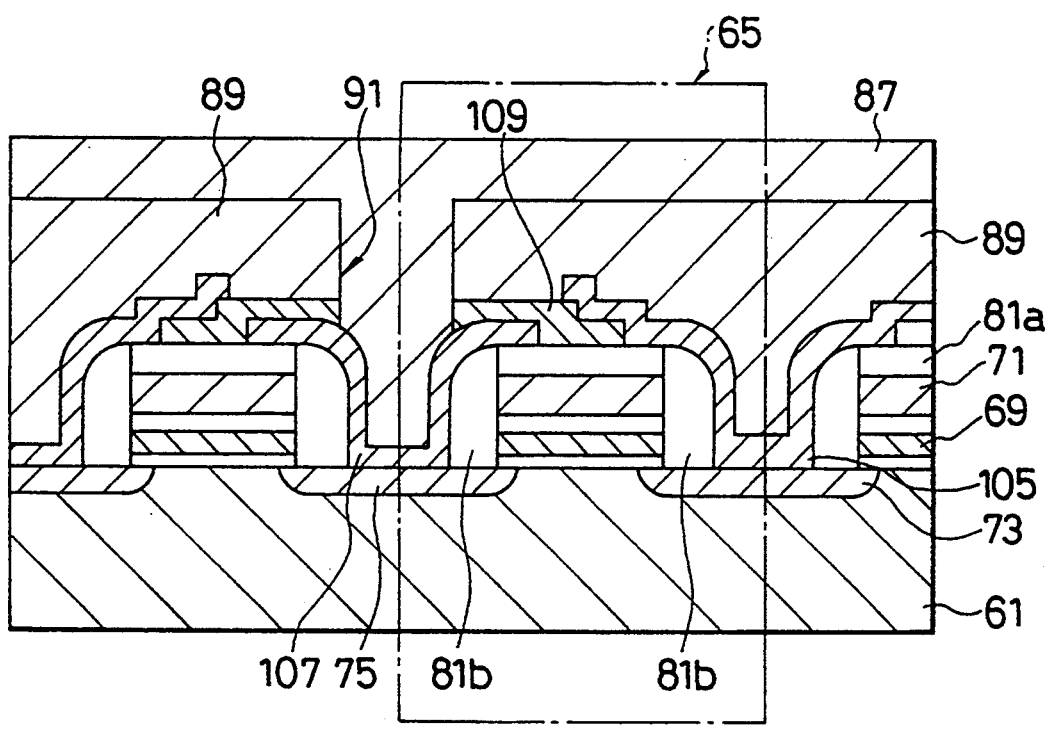
FIG. 25 is a sectional drawing of another novel nonvolatile semiconductor memory.

The utility of the above three fabrication methods can be readily understood from FIG. 25, which shows an embodiment of the memory in accordance with the present invention that can be fabricated by more conventional methods. Elements in FIG. 25 that are identical to elements in FIG. 4 have the same reference numerals, and descriptions of these elements have been omitted.

The main structural difference between FIGS. 4 and 25 is that in FIG. 25, the source interconnecting lines 105 and drain pads 107 are mutually separated by an intermediate insulating film 109. This intermediate insulating film 109 permits the source interconnecting lines 105 to approach the drain pads 107 to within a distance less than the resolution limit of the photolithography process, so that integration can be increased by reducing the dimension $y_C$ in FIG. 5.

The source interconnecting lines 105 in FIG. 25 partly overlie the intermediate insulating film 109, which partly overlies the drain pads 107. This structure can be created by first depositing and patterning the drain pads 107, then depositing and patterning the intermediate insulating film 109, then depositing and patterning the source interconnecting lines 105. That would be the conventional approach to the fabrication of the invented memory.

The memory structure in FIG. 25 provides the same advantages as the structure in FIG. 4 (reduced source resistance, more uniform program/erase characteristics, and improved integration density), but its fabrication requires one deposition, photolithography, and etching process for the drain pads 107, another deposition, photolithography, and etching process for the intermediate insulating film 109, then yet another deposition, photolithography, and etching process for the source interconnecting lines 105. In contrast, the three fabrication methods in accordance with the present invention deposited and etched the source interconnecting lines and drain pads simultaneously, and there was no intermediate insulating film 109 to be formed. The invented methods are therefore more efficient, and can be expected to provide higher production throughput.

The overlap relationships in FIG. 25 can be reversed: the drain pads can overlie the intermediate insulating film, which then overlies the source interconnecting lines. Furthermore, the invented memory and fabrication methods are not limited to the materials described in FIGS. 4 to 25; other suitable materials can be employed instead, and those skilled in the art will recognize that still further modifications can be made without departing from the scope of the invention as claimed below.

What is claimed is:

1. A nonvolatile semiconductor memory device having a plurality of memory cells, each of said memory cells having a floating gate, a control gate, a source and a drain, said device comprising:
   a semiconductor substrate:
   a plurality of active regions formed in said semiconductor substrate as parallel strips extending in a first direction and arranged separately from one another, each of said active regions having said sources, said drains, and having channels which are arranged between said sources and said drains;
   said plurality of floating gates being formed over respective channels;
   a plurality of control gate lines extending in a second direction different from said first direction, each of said control gate lines having said plurality of control gates formed over respective floating gates;
   a plurality of insulating films covering upper surface of respective control gate lines and sides of respective control gate lines and floating gates; and
   a plurality of source interconnecting lines formed on said semiconductor substrate and a portion of said insulating films as parallel strips of a conductive material, extending in said second direction, for interconnecting said sources arranged in different active regions.

2. The memory device of claim 1, wherein said first direction and said second direction are mutually perpendicular.

3. The memory device of claim 1, wherein said source interconnecting lines comprise a refractory metal.

4. The memory device of claim 3, wherein said source interconnecting lines comprise tungsten.

5. The memory device of claim 1, further comprising:
   a plurality of pads formed of a conductive material on respective drains; and
   a plurality of bit lines formed as parallel strips extending in said first direction, making contact with said pads arranged in the same active regions.

6. The memory device of claim 5, wherein said pads comprise a conductive material identical to the conductive material of said source interconnecting lines.

7. A nonvolatile semiconductor memory device comprising:
   a semiconductor substrate;
   a first active region formed in said semiconductor substrate extending in a first direction, said first active region having a first source, a first drain, a second drain, a first channel and a second channel, wherein said first channel is formed between said first source and said first drain and said second channel is formed between said first source and said second drain;
   a second active region formed in said semiconductor substrate extending in said first direction, said first and second active regions being formed separately from each other, said second active region having a second source, a third drain, a fourth drain, a third channel and a fourth channel, wherein said third channel is formed between said second source and said third drain, and said fourth channel is formed between said second source and said fourth drain;

first to fourth floating gates respectively formed over said first to fourth channels;

a first control gate line extending in a second direction from said first direction, said first control gate line including a first control gate formed over said first floating gate and a second control gate formed over said third floating gate;

a second control gate line extending in said second direction, said second control gate line including a third control gate formed over said second floating gate and a fourth control gate formed over said fourth floating gate;

an insulating film covering upper surfaces of said first and second control gate lines and sides of said first and second control gate lines and said first to fourth floating gates;

a source interconnecting line formed on said semiconductor substrate and a portion of said insulating film for interconnecting said first and second sources;

a first drain interconnecting line formed over said first active region for interconnecting said first and second drains; and a second drain interconnecting line formed over said second active region for interconnecting said third and fourth drains.

8. The memory device of claim 7, wherein said first direction and said second direction are mutually perpendicular.

9. The memory device of claim 7, wherein said source interconnecting lines comprise a refractory metal.

10. The memory device of claim 9, wherein said source interconnecting lines comprise tungsten.

11. The memory device of claim 7, wherein said first source is provided in common for said first and third control gates and said second source is provided in common for said second and fourth control gate.

12. The memory device of claim 7, further comprising:

a first pad disposed between said first drain and said first drain interconnecting line;

a second pad disposed between said second drain and said first drain interconnecting line;

a third pad disposed between said third drain and said second drain interconnecting lines; and a fourth pad disposed between said fourth drain and said second drain interconnecting line.

* * * * *